United States Patent
Hagio et al.

(10) Patent No.: US 7,959,400 B2
(45) Date of Patent: Jun. 14, 2011

(54) ALIGNER, WAFER TRANSFERRING DEVICE, AND SEMICONDUCTOR PRODUCTION DEVICE

(75) Inventors: Mitsuaki Hagio, Fukuoka (JP); Shin Osaki, Fukuoka (JP); Keisuke Yoshino, Fukuoka (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 909 days.

(21) Appl. No.: 11/873,770

(22) Filed: Oct. 17, 2007

(65) Prior Publication Data
US 2008/0095600 A1 Apr. 24, 2008

(30) Foreign Application Priority Data
Oct. 19, 2006 (JP) .................. 2006-285103

(51) Int. Cl.
*H01L 21/68* (2006.01)
(52) U.S. Cl. ....................... 414/783; 414/936
(58) Field of Classification Search ........... 414/783, 414/936, 941; 279/118, 119
See application file for complete search history.

(56) References Cited

U.S. PATENT DOCUMENTS

| 4,770,600 A * | 9/1988 | Ishikawa ............. 414/783 |
| 4,788,994 A * | 12/1988 | Shinbara ............. 134/157 |
| 5,100,502 A * | 3/1992 | Murdoch et al. ...... 414/744.1 |
| 5,566,466 A * | 10/1996 | Hearne ............... 34/58 |
| 5,851,041 A * | 12/1998 | Anderson et al. ...... 294/106 |
| 5,990,650 A * | 11/1999 | Brock ............... 318/640 |
| 7,789,614 B2 * | 9/2010 | Yoshino et al. ....... 414/783 |
| 2004/0060195 A1 * | 4/2004 | Garcia et al. ........ 34/445 |
| 2006/0245846 A1 * | 11/2006 | Moura et al. ........ 414/217 |

* cited by examiner

*Primary Examiner* — Charles A Fox
(74) *Attorney, Agent, or Firm* — Westerman, Hattori, Daniels & Adrian, LLP

(57) ABSTRACT

In a preferred embodiment, an aligner includes a grip mechanism provided with a plurality of damp arms for holding an external periphery of a wafer; a rotary mechanism for rotating the grip mechanism to rotate the wafer in a prescribed rotational direction, and a lifter mechanism provided with a plurality of lift arms for lifting up the wafer above the grip mechanism. The aligner is configured to align the wafer by the grip operation of the grip mechanism and the rotary operation of the rotary mechanism, and one or more of the plurality of the lift arms which interfere with one or more of the plurality of clamp arms at the time of lifting up the plurality of lift arms are engaged with restriction members provided on the grip mechanism to prevent an upward movement thereof.

10 Claims, 5 Drawing Sheets

ALIGNER, WAFER TRANSFERRING DEVICE, AND SEMICONDUCTOR PRODUCTION DEVICE

This application claims priority under 35 U.S.C. §119 to Japanese Patent Application No. 2006-285103 filed on Oct. 19, 2006.

BACKGROUND OF THE INVENTION

1. Field of the Invention

The present invention relates to, inter alia, an aligner for use in production/inspection devices for semiconductors, a wafer transferring device equipped with the aligner, and a semiconductor production device equipped with the water transferring device. More specifically, the present invention relates to a pre-aligner for centering a wafer or adjusting an orientation angle of a notch or the like formed on a peripheral edge of a wafer, a wafer transferring device equipped with the aligner, and a semiconductor production device equipped with the water transferring device.

2. Description of Related Art

The following description sets forth the inventor's knowledge of related art and problems therein and should not be construed as an admission of knowledge in the prior art.

In a semiconductor production device or the like, a pre-aligner is mainly used in combination with a wafer handling robot and configured to detect a specific cut-out portion formed on an external periphery of a wafer called "notch" or "orientation flat" with a detection sensor mounted on the pre-aligner while revolving the wafer transferred from the wafer handling robot and to align the wafer to a prescribed angular orientation based on the detected information. In a recent semiconductor production apparatus, the pre-aligner is installed together with a wafer handling robot within the so-called locally cleaned housing isolated by a box at a filtered downstream flow side. At the side of the housing, a cassette opener (called "POD opener" or "FOUP opener") for opening/closing a cassette (e.g., FOUP) storing wafers is provided so that the cassette can be opened/closed with the cassette opener without introducing non-cleaned atmosphere existing outside the housing. While aligning the wafer in the cassette with the pre-aligner, the wafer handling robot transfers the aligned wafer to a processing device arranged adjacent to the housing. The processing device executes prescribed processing, such as, e.g., CVD, etching, or exposure. The wafer processed by the processing device is returned to the cassette again. In this case, the housing constitutes a transferring device called "front-end device." Furthermore, other housings have been developed. In a housing, a plurality of cassette openers are provided at the side of the housing so that a wafer housing handling robot transfers a wafer while aligning it with the aligner among the plurality of cassettes above the plurality of cassette openers. This housing is a transferring device called "sorter" or the like. In any event, a pre-aligner has been widely used in semiconductor production devices to align a position and/or direction of a wafer.

In a conventional prealigner, holding of a wafer has been widely performed by a wafer vacuum absorption method. However, in accordance with the recently increased wafer diameter and design rule miniaturization, particles not only on a top surface of a wafer but also on a bottom surface of the wafer have become an issue. In a vacuum absorption system, contamination of a wafer bottom surface due to the contact of the absorption holding member is inevitable. Under the circumstance, a prealigner equipped with a gripping arm for holding an edge (external peripheral portion) of a wafer has been developed.

For similar reasons, also in a wafer handling robot, such edge gripping has become mainstream for a wafer holding portion for disposing and transferring a wafer called an "end effector," and has been used in combination with an edge-holding type pre-aligner In the case of using an edge-holding type pre-aligner and a wafer handling robot in a transferring device, it is required to deliver a wafer while keeping a predetermined mutual positional relationship to avoid mutual interference of the gripping arm of the pre-aligner and the end effector of the robot.

The positional relationship will be explained together with the movements of the pre-aligner and handling robot. When a wafer is transferred from the robot to the pre-aligner, the wafer is transferred to the pre-aligner with the notch portion taking an arbitrary position (i.e., in a state in which the notch position is unknown). At this time, to avoid the aforementioned mutual interference of the end effector and the gripping arm, the gripping arm is preliminarily rotated to a position where the gripping arm does not interfere with the end effector. In other words, at the time of transferring a wafer, the gripping arm and end effector should keep a prescribed positional relation.

The prealigner receiving a wafer detects the notch position with a notch detection sensor mounted on a part of the device while revolving the gripped wafer, and then rotates the wafer so that the notch takes a subscribed angular position required by a user. However, the position of the gripping arm after completion of the movement to the required notch angular position does not always satisfy a prescribed positional relation where the handing robot can transfer the wafer. Accordingly while keeping the position of the aligned wafer, it is required to move only the gripping arm to the prescribed position. Thus, in order to temporarily pass a wafer with the notch aligned and revolve the gripping arm to a prescribed position, it is required to equip a lifter for moving the wafer to the upper side of the gripping arm. The gripping of the wafer by the gripping arm is once released and the wafer is lifted up in a direction above the gripping arm. In this state, the gripping arm is moved (rotated) to a prescribed position, and then the wafer is returned to being disposed on the gripping arm by lowering the lifter. As a result, it becomes possible to insert the end effector of the handling robot, which enables the pick-up of the wafer by the wafer handling robot. Thus, the series of operations is completed.

In this lifter, only the edge portion of the wafer is a contact allowable portion. However, the gripping arm and the lifter commonly come into contact with the edge portion of the wafer, and the gripping arm takes an arbitrary position with respect to the notch angle aligned position. Therefore, at the time of moving the lifter up and down, the lifter may sometimes interfere with the gripping arm portion. That is, the gripping arm may sometimes be located within the lifting operation area of the notch angle positioned lifter.

As explained above, in order to transfer the wafer to the handling robot, it is required to move (rotate) the gripping arm to a previously determined prescribed position. Without avoiding this interference, the continuous operation as a transferring device cannot be performed.

An example for avoiding interference between a gripping arm and a lifter is disclosed in Japanese Unexamined Laid-open Patent Publication No. 2002-151577, A. As shown in FIGS. 11 and 12, the example disclosed in the aforementioned Patent Publication is provided with a plurality of divided substrate holding ledges which move up and down. A plurality of integrally formed substrate holding ledges arranged radially with respect to the rotational center constitute an up-and-down movable holding member. A plurality of up-and-down movable holding members are provided in an individual movable manner. That is, by forming plural groups of lifters, in the case where a certain group of lifters interferes with the gripping arm when the group of lifters is moved upwards, the interference is avoided by moving other groups of lifters.

However, in the device disclosed by the aforementioned Patent Publication, a plurality of divided substrate holding ledges are provided, and the holding ledges and other substrate holding ledges arranged radially with respect to the rotational center constitute an integrally formed up-and-down movable member. A plurality of up-and-down movable members are provided. Accordingly, as shown in FIG. 11, it is required to arrange the up and down movable members in the up-and-down direction, which increases the height of the device. Furthermore, each substrate holding ledge and the up-and-down movable holding member are separately constituted in an up-and-down movable manner. This requires individual driving power sources, resulting in complex structure and increased number of parts, which in turn increases the size of the device and the cost.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the abovementioned and/or other problems in the related art The preferred embodiments of the present invention can significantly improve upon existing methods and/or apparatuses.

Among other potential advantages, some embodiments can provide an aligner small in size, low in height, relatively simple in structure and also low in cost and capable of avoiding interference between a clamp arm and a lifter.

Among other potential advantages, some embodiments can provide a wafer transferring device equipped with the aligner.

Among other potential advantages, some embodiments can provide a semiconductor production device equipped with the wafer transferring device.

According to a first aspect of a preferred embodiment of the present invention, an aligner includes a grip mechanism provided with a plurality of clamp arms for holding an external periphery of a wafer, each of the plurality of clamp arms being provided with a restriction member at a lower portion of the clamp arm, a rotary mechanism for rotating the grip mechanism to rotate the wafer in a prescribed rotational direction, and a lifter mechanism provided with a plurality of lift arms for lifting the wafer above the grip mechanism, wherein the aligner is configured to align the wafer by a grip operation of the grip mechanism and a rotary operation of the rotary mechanism, wherein the rotary mechanism rotates the grip mechanism relative to the lifter mechanism such that the aligner is in either an interfering state, in which at least one of the damp arms is positioned in an upward movement path of at least one of the lift arms, or a non-interfering state, in which none of the clamp arms are disposed in the upward movement path of the lift arms, and wherein, in the interfering state, at least one of the lift arms engages with the restriction member provided on the lower portion of at least one of the damp arms of the grip mechanism, in order to restrict an upward movement of at least one of the lift arms.

According to the aforementioned embodiment, it is not required to mount a plurality of lifter mechanisms as disclosed by the aforementioned Patent Publication showing an example of a conventional interference avoiding means, thereby decreasing the number of parts. Therefore, the device can be miniaturized, especially in the height direction, which makes it possible to provide a low cost aligner Especially, in the aforementioned embodiment, only the lift arms among the plurality of lift arms which interfere with the clamp arms are configured not to be lifted up, enabling the wafer to safely pass the lift arm above the wafer without causing the interference between the parts. Thus, the clamp arm can be assuredly rotated to a prescribed position.

In some embodiments, in the aligner, it is preferable that each of the plurality of lift arms is provided with a restriction member receiver guided along a lift arm rod upwardly protruded in the aligner and capable of being engaged with the restriction member, and wherein, in the interfering state, when the restriction member of the clamp arm is positioned in the upward movement path of the restriction member receiver of the lift arm at the time of lifting the plurality of lift arms, the restriction member receiver of the lift arm engages with the restriction member of the clamp arm to restrict the upward movement of the lift arm.

In this embodiment, the purpose of the present invention can be easily attained by simply engaging the restriction member receiver with the restriction member In some embodiments, in the aligner, it is preferable that each of the plurality of lift arms is provided with a lift claw having an inclined surface for supporting the external periphery of the wafer.

In this embodiment, at the time of holding the wafer with the clamping claws, the clamping claws simply come into contact with the edge of the external periphery of the wafer, causing less particles.

In some embodiments, in the aligner, it is preferable that the lifter mechanism includes a lifting ring configured to engage with a connection detachment mechanism provided at each of the plurality of lift arms, and a lifting cylinder connected to a part of the lifting ring to lift the lifting ring, whereby all of the plurality of lift arms may simultaneously ascend/descend by a lifting operation of the lifting ring.

In this embodiment, the plurality of lift arms can be simultaneously moved up and down with the lifting ring.

In some embodiments, in the aligner, it is preferable that the connection detachment mechanism includes a connecting member having a first engaging portion, a bearing for rotatably connecting the connecting member to the lift arm, and a spring urging the connecting member in a prescribed direction, wherein the lifting ring has a first ring engaging portion at an inner periphery of the lifting ring, wherein, in the interfering state or the non-interfering state, when the lifting ring is in a lowered position, the first ring engaging portion abuts a lower portion of the first engaging portion, wherein, in the interfering state or the non-interfering sate, when the lifting ring is lifted, the lift arm is pushed up in a state in which the first engaging portion and the first ring engaging portion are in contact with each other due to the urging force of the spring, and wherein, in the interfering state, when the resection member receiver comes into contact with the restriction member, the connecting member is rotated by the lifting of the lifting ring and the first engaging portion is detached from the first ring engaging portion by exceeding the urging force of the spring, thereby restricting the upward movement of at least one of the lift arms.

In this embodiment, when the restriction member receiver comes into contact with the restriction member, since the connecting member is urged in a certain direction by the spring, when the lifting ring is further lifted up, the first engaging portion of the connecting member is detached from the first ring engaging portion. Therefore, the upward movement of the lift arm can be assuredly restricted (stopped).

In some embodiments, in the aligner, it is preferable that an upper surface of the first ring engaging portion and a lower surface of the first engaging portion are formed into an inclined surface inclined toward a center of the lifting ring.

In this embodiment, when the restriction member receiver comes into contact with the restriction member, the detaching operation of the first engaging portion from the first ring engaging portion can be performed smoothly.

In some embodiments, in the aligner, it is preferable that the connecting member further includes a second engaging portion at a lower portion of the first engaging portion, wherein the lifting ring further includes a second ring engaging portion at a lower portion of the first ring engaging portion, wherein, in the interfering state or the non-interfering state, when the lifting ring is in a lowered position, the first ring engaging portion is located between the first engaging portion and the second engaging portion and the second ring engaging portion is located below the second engaging portion, and wherein, in the interfering state, after the lifting ring is lifted up and the first engaging portion is detached from the first ring engaging portion by exceeding the urging force of the spring, the second engaging portion and the second ring engaging portion come into contact with each other, and the connecting member is held with the space between the first engaging portion and the second engaging portion facing to the first ring engaging portion.

In this embodiment, when the restriction member receiver and the restriction member come into contact with each other to cause detachment of the first engaging portion from the first ring engaging portion and then the lifting ring is lowered, the parts can be returned to the original state.

In some embodiments, in the aligner, it is preferable that the number of the lift arms is more than the number of the clamp arms by at least three.

In this embodiment, even if all of the clamp arms restrain the corresponding lift arms, since the number of lift arms is larger than that of the clamp arms, the corresponding lift arms can be prevented from being lifted up by the clamp arms.

According to a second aspect of a preferred embodiment of the present invention, a wafer transferring device includes a cassette for storing wafers, a cassette opener for opening/closing a lid of the cassette, a wafer handling robot for transferring the wafer to/from the cassette opened by the cassette opener, and an aligner for aligning the wafer while transferring the wafer from/to the wafer handling robot, wherein the aligner is any one of devices mentioned above.

In this embodiment, a compact and low cost device can be provided.

According to a third aspect of a preferred embodiment of the present invention, a semiconductor production device is equipped with the aforementioned wafer transferring device.

In this embodiment, a small and low cost device can be provided.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the present invention will be described by way of example and not limitation. It should be understood based on this disclosure that various other modifications can be made by those in the art based on these illustrated embodiments.

Figure 1A:
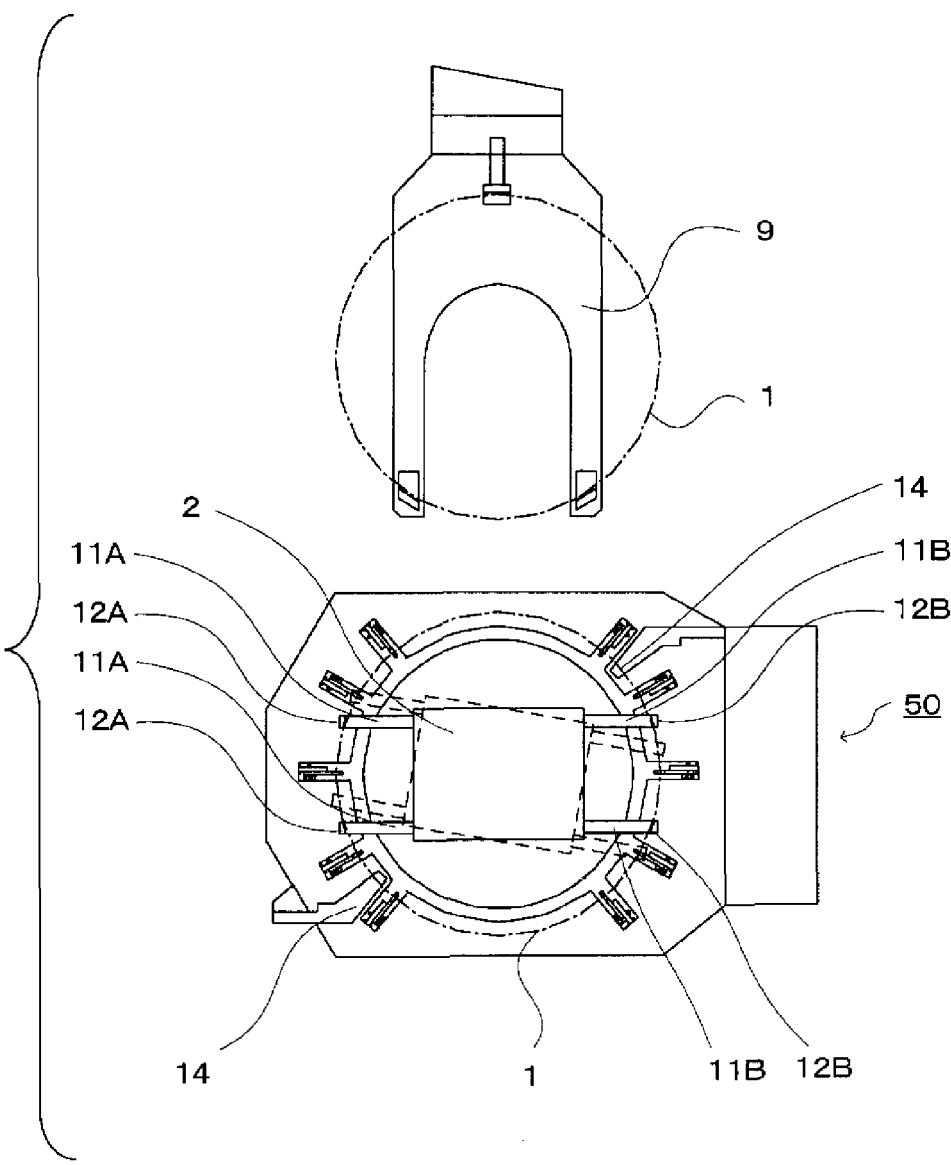
FIG. 1A is a top view showing a pre-aligner and an end factor of a wafer handing robot according to an embodiment of the present invention.
Figure 1B:
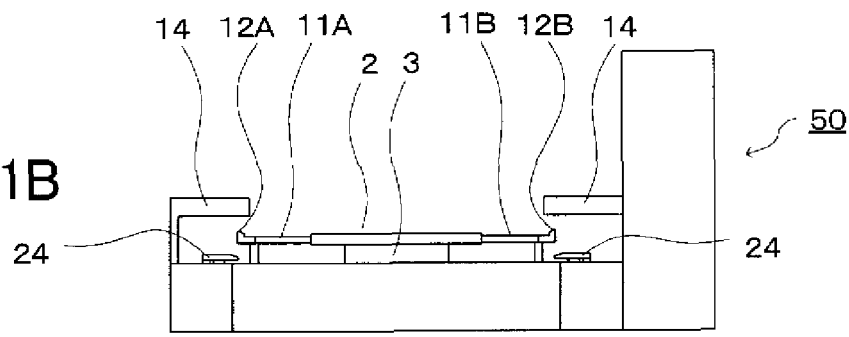
FIG. 1B is a side view of the pre-aligner shown in FIG. 1A.
Figure 2:
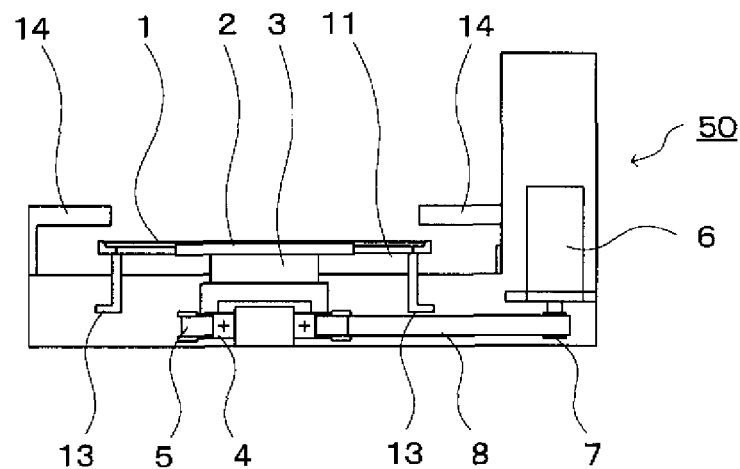
FIG. 2 is a side cross-sectional view mainly showing a rotary mechanical section of the pre-aligner.
Figure 3:
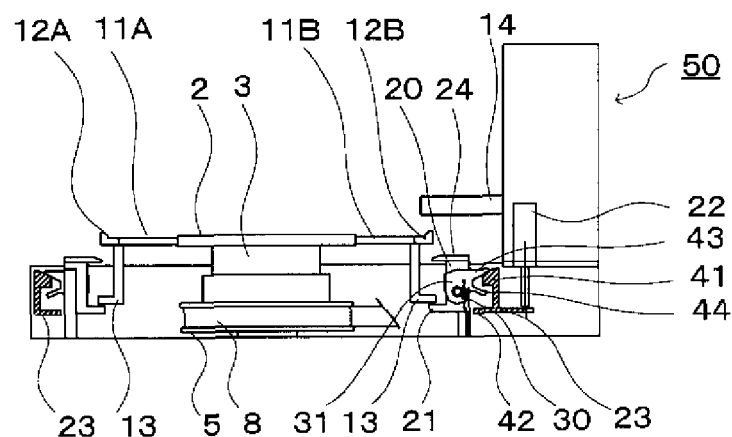
FIG. 3 is a side cross-sectional view mainly showing a lifter mechanical section of the pre-aligner.
Figure 4:
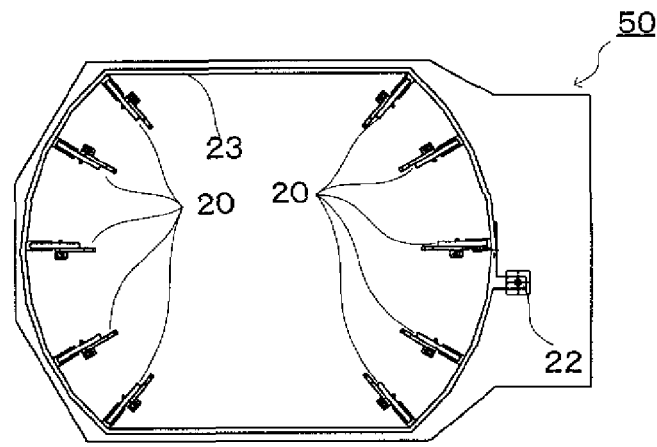
FIG. 4 is a top view showing a lifter mechanism of the pre-aligner.
Figure 5:
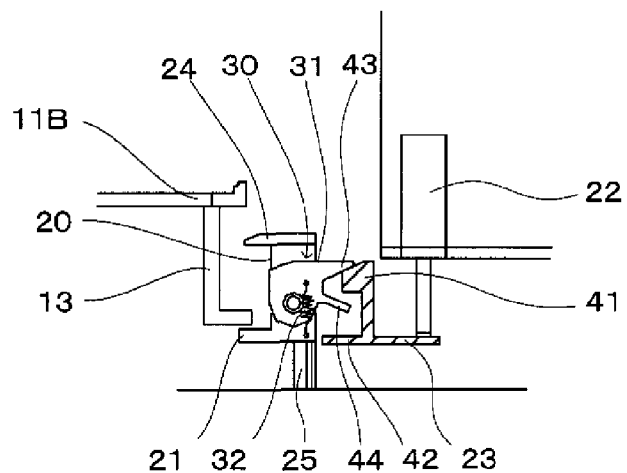
FIG. 5 is a partial side view showing one lift arm portion of the lifter mechanism in the lowered state.
Figure 6:
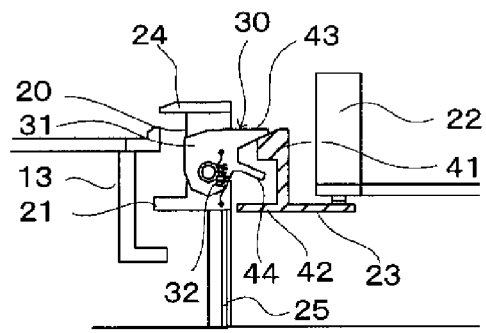
FIG. 6 is a partial side view of the lifter mechanism in the raised state.
Figure 7:
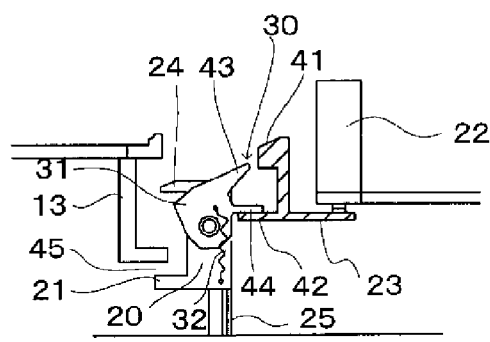
FIG. 7 is a side view of the not-lifted up lift arm in a state in which the lifter mechanism is lifted up.
Figure 8:
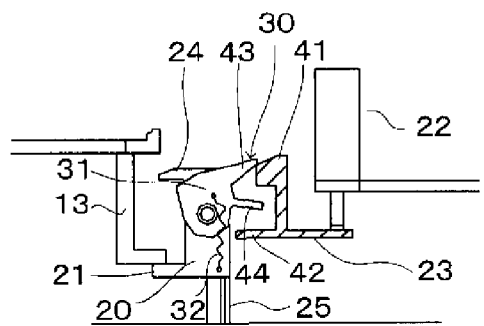
FIG. 8 is a side view of the lifter in the middle of the operation immediately before me separation of the connection detachment mechanism or immediately after the connection thereof.
Figure 9:
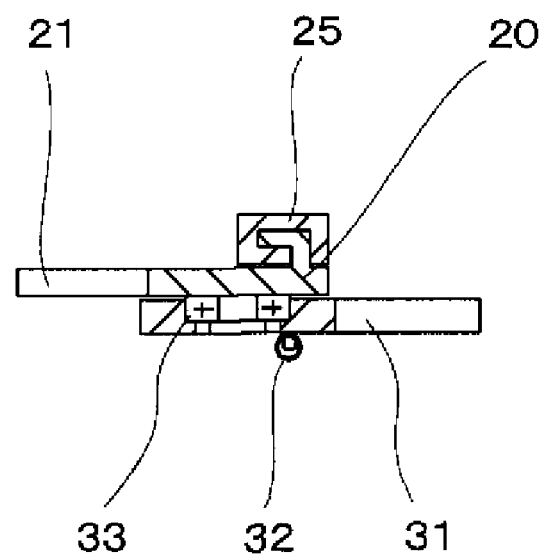
FIG. 9 is a partial cross-sectional view of the upper surface of the lift arm portion and the connection detachment mechanism.
Figure 10:
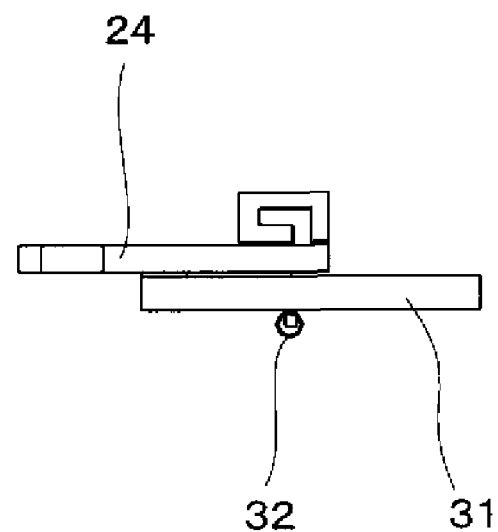
FIG. 10 is a top view of the lift arm portion and the connection detachment mechanism.
Figure 11:
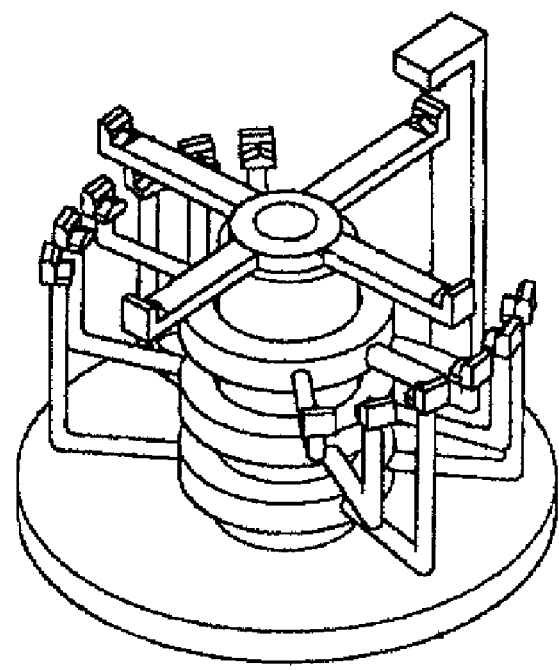
FIG. 11 is a perspective view of a conventional prealigner.
Figure 12:
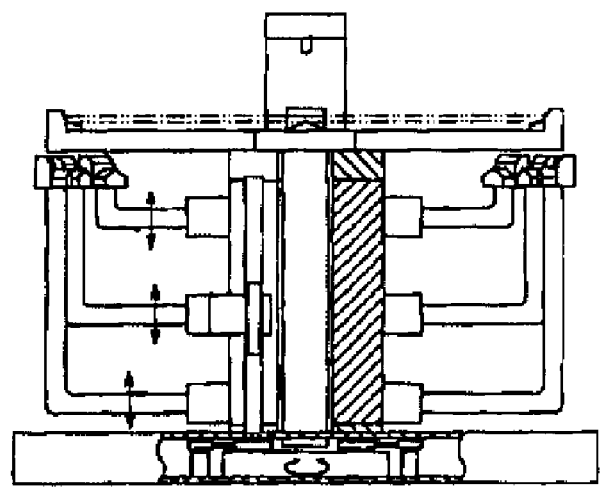
FIG. 12 is a partially cross-sectional side view of the pre-aligner shown in FIG. 11.

FIG. 1A shows a top view of a pre-aligner according to an embodiment of the present invention and an end factor of a wafer handing robot for disposing a wafer on the pre-aligner FIG. 1B shows a side view of the prealigner. FIG. 2 is a side cross-sectional view mainly showing a rotary mechanical section of the pre-aligner. FIG. 3 is a side cross-sectional view mainly showing a lifter mechanical section of the pre-aligner FIG. 4 is a top view showing the lifter mechanism of the pre-aligner. FIG. 5 is a partial side view showing one lift arm portion of the lifter mechanism in the lowered state. FIG. 6 is a partial side view of the lifter mechanism in the raised state. FIG. 7 is a side view of the lifter in the raised state with the lift arm reached the upper most position. FIG. 8 is a side view of the lifter in the middle of the operation immediately before the separation of the connection detachment mechanism or immediately after the connection thereof. FIG. 9 is a partial cross-sectional view of the upper surface of the lift arm portion and the connection detachment mechanism. FIG. 10 is a top view of the lift arm portion and the connection detachment mechanism.

Hereinafter, the structure of the preferable embodiment of the present invention will be explained with reference to the aforementioned figures. This device has a grip mechanism including a damp arm for holding an external periphery of a wafer, a rotary mechanism for rotating the wafer held by the grip mechanism, a sensor mechanism for detecting a specific configuration of a notch or an orientation flat formed on the external peripheral portion of the wafer to be rotated by the rotary mechanism, and a lifter mechanism for temporarily lifting up the wafer so that only the damp arm is rotated to a prescribed position to avoid the interference between the clamp arm in the state in which the alignment was completed as mentioned above and the end effector of the wafer handling robot.

Initially, the aforementioned grip mechanism and rotary mechanism will be explained. In FIGS. 1 and 2, the reference numeral "1" denotes a wafer to be aligned by the device. "2" denotes a rotary base connected to a cylindrical hollow rotary shaft 3 disposed under the rotary base 2 and rotatably supported with respect to the aligner body 50 by a bearing 4 and a pulley 5 having a hollow aperture disposed on the axis of the rotary shaft 3. The pulley 5 is connected to the pulley 7 attached to the end of the output shaft of the position detectable rotary motor 6, such as, e.g., a servo motor, via the timing belt 8. Thus, the rotary base 2 is configured to be rotated in accordance with the rotation of the rotary motor 6. The aforementioned members constitute the rotary mechanism.

The rotary base 2 is provided with two pairs of damp arms 11A and 11B. The clamp arms 11A and 11B are configured to more towards each other and move away from each other on the same straight line by a clamp mechanism mounted on the rotary base 2 and the rotary shaft 3. The damp arms 11A and 11B are configured to hold the edge portion of the wafer 1 with the clamping claws 12A and 12B by linearly moving towards each other. This clamp driving mechanism is disclosed in the U.S. Pat. No 7,789,614 (incorporated herein by reference) filed by the present applicant. The clamping claws 12A and 12B are arranged so that the center of the wafer 1 in a clamped state and the center of rotation of the rotary base 2 coincide with each other when the clamping claws 12A and 12B hold the wafer 1 by the linear movement of the clamp arms 11A and 11B. The aforementioned members constitute the grip mechanism.

As the aforementioned sensor mechanism, a notch detection sensor 14 is disposed at positions where specific portions formed on the external periphery of the wafer 1, such as, e.g., a notch or an orientation flat, can be detected when the wafer 1 held by the grip mechanism is rotated.

The aforementioned rotary mechanism, grip mechanism, and sensor mechanism are publicly known mechanisms.

In this preferred embodiment, at the lower portion of each of the damp arms 11A and 11B, a restriction member 13 having a width the same as or wider than the width of the clamp arms 11A and 11B is provided so as to be positioned at a height within the vertical movement range of the restriction member receiver 21 of the lifter, which will be mentioned later. The restriction member 13 is configured so as to be located at a position above the restriction member receiver 21 under normal conditions (when the below-mentioned lifting ring 23 is in a lowered state), so that the restriction member 13 does not interfere with the restriction member receiver 21 under normal conditions even if the restriction member 13 rotates together with the clamp arms 11A and 11B. It should be understood that the mounting position of the restriction member 13 is not limited to the lower position of the clamp arms 11A and 11B so long as it is positioned lower than the clamp arms 11A and 11B as seen from the upper side of this device as shown in FIG. 1A. For example, the damp arms 11A and 11B can be mounted on the rotary base 2 or another portion.

Next, the lifter mechanism of the preferred embodiment will be explained. As shown in FIGS. 3 to 5, at positions approximately corresponding to the external periphery of the wafer 1, a plurality of lift arms 20 are arranged in a vertically movable manner along the lift arm supporting posts 25 upwardly extended in the device. Each lift arm 20 is vertically movable with respect to the lift arm supporting post 25 having a guide groove. Each lift arm 20 is comprised of a connection detachment mechanism 30, the restriction member receiver 21, and a lift claw 24 configured to support the peripheral edge portion of the wafer 1. The lift daw 24 is formed to be inclined to avoid the contact with the bottom surface of the wafer 1, so that the lift claw 24 is configured to support only the peripheral edge of the wafer 1 without coming into contact with the bottom surface of the wafer 1. The lift arms 20 are arranged at the outside of the rotary operation range of the clam arms 11A and 11B. Each of the lift arms 20 is disposed so as to be engaged with the annular lifting ring 23 via the connection detachment mechanism 30, which will be mentioned below, as shown in FIG. 4.

As shown in FIGS. 1A and 1B, when the lifting ring 23 moves up, the lift claws 24 on the lift arms 20 protrude from the upper surface of the aligner body 50 and when the lifting ring 23 moves down, the lift claws 24 on the lift arms 20 retract into their original positions.

The lifting ring 23 is, at its entire inner peripheral region, provided with at least two protrusions, i.e., a first ring engaging portion 41 and a second ring engaging portion 42, capable of being engaged with the connection detachment mechanism 30 of the lift arm 20. The upper surface of the first ring engaging portion 41 is formed into an inclined surface inclined toward the center of the lifting ring 23. A lifting cylinder 22 is connected to a part of the lifting ring 23, so that the lifting ring 23 is movable in the up-and-down direction in FIG. 3. Thus, the lifting ring 23 and each lift arm 20 can be moved in the up-and-down direction in accordance with the operation of the lifting cylinder 22 with the lifting ring 23 engaged with the connection detachment mechanisms 30.

The engagement of the connection detachment mechanism 30 of each lift arm 20 and the lifting ring 23 will be explained. As shown in FIGS. 5, 9 and 10, the connection detachment mechanism 30 is comprised of a connecting member 31, a spring 32, and a bearing 33. The connecting member 31 is rotatably supported by the lift arm 20 via the bearing 33 with the connecting member 31 being always urged clockwise in FIG. 5 by the tensile load of the spring 32 provided between the lift arm 20 and the connecting member 31. The connecting member 31 is provided with a first engaging portion 43 and a second engaging portion 44 facing each other in the up-and-down direction. The first engaging portion 43 and the second engaging portion 44 protrude from the connecting member 31 such that the first engaging portion 43, the second engaging portion 44 and the connecting member 31 form an approximately U-shape. Under normal conditions (in a state in which the lifting ring 23 is lowered), as shown in FIG. 5, the lower surface of the first engaging portion 43 is in contact with the inclined surface of the first ring engaging portion 41 of the lifting ring 23. Furthermore, the first ring engaging portion 41 is positioned between the first engaging portion 43 and the second engaging portion 44, and the second ring engaging portion 42 is positioned below the second engaging portion 44. In other words, the U-shaped recess formed by the first engaging portion 43, the second engaging portion 44 and the connecting member 31 receives the first ring engaging portion 41.

Now, the operation of the aforementioned aligner will be explained. As shown in FIG. 1A, when the wafer 1 is transferred from the end effector 9 of the wafer handling robot onto the clamp arms 11A and 11B, the clamp arms 11A and 11B are linearly moved towards each other to hold the peripheral edge of the wafer 1 with the damp claws 12A and 12B. With the wafer 1 held by the clamp claws 12A and 12B, the wafer 1 is rotated by the rotary mechanism to detect the notch or the orientation flat formed on the external periphery of the wafer 1 by the notch detection sensors 14 and is further rotated so that the notch or the orientation flat is positioned to a prescribed position required by a user. With this rotational movement, the rotational direction of the wafer 1 is decided. Thereafter, the clamp arms 11A and 11B are moved away from each other to release the wafer 1, and the lifting ring 23 is lifted up by operating the lifting cylinder 22 to raise each lift arm 20. Thus, the wafer 1 is lifted up with the wafer 1 disposed on the lift claws 24 (i.e, changed from the state shown in FIG. 5 to the state shown in FIG. 6). Here, FIG. 6 depicts a state that the damp arms 11A and 11B and the lift arm 20 do not overlap with each other as shown by the solid in FIG. 1A. Specifically in FIG. 6, the restriction member 13 is located in front of or behind the lift arm 20, from a side view, such that the restriction member 13 is not disposed in the upward movement path on the lift arm 20. At this time, the wafer 1 will be slightly detached from the damp claws 12A and 12B. That is, by retreating the rod of the lifting cylinder 22, the lifting ring 23 is lifted up. At this state, since the first ring engaging portion 41 of the lifting ring 23 is in contact with the first engaging portion 43 of the connection detachment mechanism 30, each lift arm 20 is lifted up to raise the wafer 1 with the wafer 1 supported by the lift claws 24.

When the wafer 1 and the lifter mechanism is in the raised position, the clamp arms 11A and 11B are rotated to a prescribed angular position capable of transferring the wafer 1 to the end effector 9. In this illustrated embodiment, the end effector 9 and the clamp arms 11A and 11B have the positional relation as shown by the solid lines in FIG. 1. Needless to say the prescribed positional relation is arbitrarily decided by the configurations of the end effector 9 and clamp arms 11A and 11B.

Again, the lifter mechanism is lowered to dispose the wafer 1 on the clamp arms 11A and 11B and the wafer 1 is received by the wafer handling robot. Thus, a series of operation is completed.

The following explanation will be directed to the case in which the clamp arms 11A or 11B are located above at least one of the lift arms 20 at the time of lifting up the wafer 1 by the lift arms 20 of the lifter mechanism, and therefore these members will interfere with each other. The explanation will be made with reference to FIGS. 5, 7 and 8. Here, the lift arm 20 moves in order of FIGS. 5, 8 and 7, and vice versa.

As shown by the broken line in FIG. 1A, when the clamp arm 11A or 11B is positioned above some of the lift arms 20, the restriction member 13 provided at the lower portion of the clamp arms 11A or 11B and the corresponding restriction member receiver 21 provided at the lift arm 20 are positioned so as to be opposed in the up-and-down direction.

At this time, when the lifting cylinder 22 is operated to lift up the lifting ring 23, all of the lift arms 20 begin to ascend (see FIG. 5). In the lift arm 20 located at the position vertically opposed to the clamp arms 11A or 11B, however, the restriction member receiver 21 will immediately come into contact with the restriction member 13 (see FIG. 8). On the other hand, in the connecting member 31 urged by the spring 32 and engaged with the first ring engaging portion 41 of the lifting ring 23, when the lifting ring 23 is further lifted up by the operation of the lifting cylinder 22, the upward force of the lifting ring 23 exceeds the urging force of the spring 32. Accordingly the first engaging portion 43 is released from the inclined surface of the first ring engaging portion 41, causing a downward movement of the lift arm 20, which results in no contact with the restriction member 13 via a gap 45. However, the lower surface of the second engaging portion 44 of the connecting member 31 will come into contact with the upper surface of the second ring engaging portion 42 of the lifting ring 23 to push up the connecting member 31 counterclockwise. Thus, the spring 32 of the connecting member 31 will be fully extended. In this state, the connecting member 31 is held with the space between the first engaging potion 43 and the second engaging portion 44 facing to the first ring engaging portion 41 (see FIG. 7). Due to the limitation of the retreating operation of the lifting cylinder 22, the lifting ring 23 stops. At this time, other lift arms 20 not interfered with the damp arms 11A and 11B are lifted up while holding the external periphery of the wafer 1 with the lift claws 24 by the contact between the lifting ring 23 and the first engaging portion 43 as discussed above.

As explained above, the interference between the clamp arm 11A or 11B and the lift arm 20 can be avoided. With this state (i.e., in the state in which the wafer 1 is lifted up by other lift arms 20), the grip mechanism can be rotated to a prescribed angular position capable of transferring the wafer 1 to and from the end effector 9 by the rotary mechanism.

The next explanation will be directed to the case in which the lifting ring 23 is lowered from the raised position, with regard to those lift arms 20 interfering with the clamp arms 11A and 11B. When the lifting ring 23 is in the raised position, the spring 32 of the connecting member 31 is in the extended state and the connecting member 31 is held with the space between the first engaging portion 43 and the second engaging portion 44 facing to the first ring engaging portion 41 (FIG. 7). Thus, when the lifting ring 23 begins to descend, the first ring engaging portion 41 enters in between the first engaging portion 43 and the second engaging portion 44 of the connecting member 31. When the engagement of the second ring engaging portion 42 and the second engaging portion 44 is released, the inclined surface of the first ring engaging portion 41 and the lower surface of the first engaging portion 43 begin to come into contact with each other (FIG. 8) to return the initial state (the state in which the lifting ring 23 is in the lowered state) (FIG. 5). On the other hand, other lift arms 20 return the wafer 1 held by the lift arms to the camp arms 11A and 11B rotated to a prescribed angular position. Thus, the wafer handling robot can take the wafer 1 without causing the interference been the end effector 9 and the clamp arms 11A and 11B.

As explained above, the lift arm 20 is configured such that the lift arm 20 can be lifted up when no damp arm 11A or 11B exists above the lift arm 20 but is restricted when a clamp arm 11A or 11B exists above the lift arm 20. The number of the lift arms 20 can be decided arbitrarily in consideration of the number of the clamp arms which cannot be lifted up. For example, the number of the lift arms 20 can be more than that of the clamp arms 11A and 11B by at least three. In this embodiment, since the number of the camp arms 11A and 11B is four, a total of at least seven (4+3) lift arms 20 are prepared and arranged in accordance with the structure of the clamp arms 11A and 11B. Considering the case in which four lift arms 20 cannot be raised by four clamp arms 11A and 11B, a wafer 1 can be stably held by the remaining three lift arms 20. Thus, while avoiding the collision between the clamp arms 11A and 11B and the lift arms 20, the wafer 1 can be stably held.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is nonexclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of critically, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. An aligner, comprising:
    a grip mechanism provided with a plurality of clamp arms for holding an external periphery of a wafer, each of the plurality of clamp arms being provided with a restriction member at a lower portion of said clamp arm;
    a rotary mechanism for rotating said grip mechanism to rotate said wafer in a prescribed rotational direction; and
    a lifter mechanism provided with a plurality of lift arms for lifting said wafer above said grip mechanism,
    wherein the aligner is configured to align the wafer by a grip operation of the grip mechanism and a rotary operation of the rotary mechanism,
    wherein said rotary mechanism rotates said grip mechanism relative to said lifter mechanism such that said aligner is in either an interfering state, in which at least one of said clamp arms is positioned in an upward movement path of at least one of said lift arms, or a non-interfering state, in which none of said clamp arms are disposed in said upward movement path of said lift arms, and
    wherein, in said interfering state, at least one of said lift arms engages with said restriction member provided on said lower portion of at least one of said clamp arms of said grip mechanism, in order to restrict an upward movement of at least one of said lift arms.

2. The aligner as recited in claim 1, wherein each of the plurality of lift arms is provided with a restriction member receiver guided along a lift arm rod upwardly protruded in the aligner and capable of being engaged with said restriction member, and
    wherein, in said interfering state, when said restriction member of said clamp arm is positioned in said upward movement path of the restriction member receiver of said lift arm at the time of lifting the plurality of lift arms, said restriction member receiver of said lift arm engages with said restriction member of said damp arm to restrict said upward movement of said lift arm.

3. The aligner as recited in claim 1, wherein each of the plurality of lift arms is provided with a lift claw having an inclined surface for supporting the external periphery of said wafer.

4. The aligner as recited in claim 1, wherein said lifter mechanism comprises:
    a lifting ring configured to engage with a connection detachment mechanism provided at each of the plurality of lift arms, and
    a lifting cylinder connected to a part of said lifting ring to lift said lifting ring,
    whereby all of the plurality of lift arms may simultaneously ascend/descend by a lifting operation of said lifting ring.

5. The aligner as recited in claim 4,
    wherein said connection detachment mechanism includes a connecting member having a first engaging portion, a bearing for rotatably connecting said connecting member to said lift arm, and a spring urging said connecting member in a prescribed direction,
    wherein said lifting ring has a first ring engaging portion at an inner periphery of said lifting ring,
    wherein, in said interfering state or said non-interfering state, when said lifting ring is in a lowered position, said first ring engaging portion abuts a lower portion of said first engaging portion,
    wherein, in said interfering state or said non-interfering state, when said lifting ring is lifted, said lift arm is pushed up in a state in which said first engaging portion and said first ring engaging portion are in contact with each other due to the urging force of the spring, and
    wherein, in said interfering state, when said restriction member receiver comes into contact with said restriction member, said connecting member is rotated by the lifting of said lifting ring and said first engaging portion is detached from said first ring engaging portion by exceeding the urging force of said spring, thereby restricting said upward movement of at least one of said lift arms.

6. The aligner as recited in claim 1, wherein an upper surface of said first ring engaging portion and a lower surface of the first engaging portion are formed into an inclined surface inclined toward a center of said lifting ring.

7. The aligner as recited in claim 5, wherein said connecting member further includes a second engaging portion at a lower portion of said first engaging portion, wherein said lifting ring further includes a second ring engaging portion at a lower portion of said first ring engaging portion, wherein, in said interfering state or said non-interfering state, when said lifting ring is in a lowered position, said first ring engaging portion is located between said first engaging portion and said second engaging portion and said second ring engaging portion is located below said second engaging portion, and wherein, in said interfering state, after said lifting ring is lifted up and said first engaging portion is detached from said first ring engaging portion by exceeding the urging force of said spring, said second engaging portion and said second ring engaging portion come into contact with each other, and said connecting member is held with the space between the first engaging portion and said second engaging portion facing to said first ring engaging portion.

8. The aligner as recited in claim 1, wherein the number of said lift arms is more than the number of said clamp arms by at least three.

9. A wafer transferring device, comprising:
- a cassette for storing wafers;
- a cassette opener for opening/closing a lid of said cassette;
- a wafer handling robot for transferring at least one of said wafers to/from the cassette opened by said cassette opener; and
- an aligner for aligning the at least one of said wafers while transferring the at least one of said wafers from/to the wafer handling robot, wherein said aligner is a device as recited in claim 1.

10. A semiconductor production device equipped with the wafer transferring device as recited in claim 9.

* * * * *